United States Patent
Tsuchi

(10) Patent No.: US 7,495,512 B2
(45) Date of Patent: Feb. 24, 2009

(54) DIFFERENTIAL AMPLIFIER, DATA DRIVER AND DISPLAY DEVICE

(75) Inventor: Hiroshi Tsuchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 105 days.

(21) Appl. No.: 11/638,535

(22) Filed: Dec. 14, 2006

(65) Prior Publication Data

US 2007/0159248 A1 Jul. 12, 2007

(30) Foreign Application Priority Data

Dec. 28, 2005 (JP) ............................. 2005-378577

(51) Int. Cl.
*H03F 3/45* (2006.01)
*G09G 5/10* (2006.01)

(52) U.S. Cl. ....................... 330/260; 345/690
(58) Field of Classification Search ................. 330/260
See application file for complete search history.

(56) References Cited

U.S. PATENT DOCUMENTS

| | | | |
|---|---|---|---|
| 4,638,260 A * | 1/1987 | Hamley | 330/254 |
| 5,075,636 A * | 12/1991 | Addis et al. | 330/260 |
| 5,311,145 A | 5/1994 | Huijsing | |
| 6,441,763 B1 | 8/2002 | Nakao | |
| 6,535,189 B1 | 3/2003 | Akiyama | |
| 6,717,468 B1 * | 4/2004 | Jeong et al. | 330/253 |
| 2005/0088390 A1 | 4/2005 | Tsuchi | |

FOREIGN PATENT DOCUMENTS

| | | |
|---|---|---|
| JP | 6-326529 | 11/1994 |
| JP | 2001-34234 | 2/2001 |
| JP | 2002-43944 | 2/2002 |
| JP | 2005-130332 | 5/2005 |

\* cited by examiner

*Primary Examiner*—Steven J Mottola
(74) *Attorney, Agent, or Firm*—McGinn IP Law Group, PLLC

(57) ABSTRACT

A differential amplifying circuit capable of reducing amplitude-difference deviation over a full range of grayscale voltages inclusive of voltages in the vicinity of power-supply voltage includes first and second differential pairs of mutually different polarities, in which the outputs of the differential pairs are coupled by a coupling stage. One of the first and second differential pairs receives an input signal from an input terminal and a feedback signal from an output terminal at a pair of inputs thereof, and the other differential pair receives reference signals (which may be of the same voltage), which have voltage levels that set the other differential pair transistors to an on-state, at a pair of inputs of the other differential pair.

20 Claims, 14 Drawing Sheets

FIG. 4

| | | AT POSITIVE DRIVE | AT NEGATIVE DRIVE |
|---|---|---|---|
| ① | SW1, SW3, SW5, SW7 | ON | OFF |
| ② | SW2, SW4, SW6, SW8 | OFF | ON |

FIG. 7

| | | AT POSITIVE DRIVE | AT NEGATIVE DRIVE |
|---|---|---|---|
| ① | SW11, SW13, SW15, SW17, SW21, SW23, SW25, SW27 | ON | OFF |
| ② | SW12, SW14, SW16, SW18, SW22, SW24, SW26, SW28 | OFF | ON |

DIFFERENTIAL AMPLIFIER, DATA DRIVER AND DISPLAY DEVICE

FIELD OF THE INVENTION

This invention relates to a differential amplifier, a data driver and a display device that employs the data driver.

BACKGROUND OF THE INVENTION

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and laptop personal computers. Recently, however, liquid crystal display devices have come to be provided with large-size screens and techniques for dealing with moving pictures have become more advanced, thus making it possible to realize not only mobile applications but also stay-at-home large-screen display devices and large-screen liquid crystal televisions. Liquid crystal display devices of an active matrix driving system which is capable of presenting a high-definition display are being utilized as these liquid crystal displays devices.

The typical configuration of an active-matrix liquid crystal display device will be described with reference to FIG. 11. The principal components connected to one pixel of a liquid crystal display unit are illustrated schematically by equivalent circuits in FIG. 11.

In general, a display unit 960 of an active-matrix liquid crystal display device comprises a semiconductor substrate on which transparent pixel electrodes 964 and thin-film transistors (TFTs) 963 are laid out in the form of a matrix (e.g., 1280×3 pixel columns×1024 pixels rows in the case of a color SXGA panel); an opposing substrate on the entire surface of which a single transparent electrode 967 is formed; and a liquid crystal material sealed between these two substrates arranged to oppose each other. The liquid crystal has capacitance and forms a capacitor 965 between the pixel electrodes 964 and electrode 967. Further, an auxiliary capacitor 966 for assisting the capacitance of the liquid crystal is provided.

In the above-described liquid crystal display device, the TFT 963, which has a switching function, is turned on and off under the control of a scan signal. When the TFT 963 is on, a grayscale signal voltage that corresponds to a video data signal is applied to the pixel electrode 964, and the transmittance of the liquid crystal changes owing to a potential difference between each pixel electrode 964 and opposing-substrate electrode 967. This potential difference is held by the liquid crystal capacitance 965 and auxiliary capacitor 966 for a fixed period of time even after the TFT 963 is turned off, as a result of which an image is displayed.

Data lines 962 that send a plurality of level voltages (grayscale signal voltages) applied to pixel electrodes 964 and scan lines 961 that send the scan signal are wired on the semiconductor substrate in the form of a grid (the data lines are 1280×3 in number and the scan lines are 1024 in number in the case of the above-mentioned color SXGA panel). The scan line 961 and data line 962 constitute a large capacitive load owing to the capacitance produced at the intersection of these lines and capacitance, etc., of the liquid crystal sandwiched between the opposing-substrate electrodes.

It should be noted that the scan signal is supplied to the scan line 961 by a gate driver 970, and that the supply of grayscale signal voltage to each pixel electrode 964 is performed by a data driver 980 via the data line 962. Further, the gate driver 970 and data driver 980 are controlled by a display controller (not shown), a required clock CLK, control signals and power-supply voltage, etc., are supplied from the display controller, and video data is supplied from the display controller 940 to the data driver 980. At the present time, video is principally digital data.

Rewriting of one screen of data is carried out over one frame (1/60 of a second), data is selected successively every pixel row (every line) by each scan line, and a grayscale signal voltage is supplied from each data line within the selection interval.

Although the gate driver 970 need only supply at least a bi-level scan signal, it is required that the data driver 980 drive the data lines by grayscale signal voltages of multiple levels that conform to the number of gray levels of the grayscale. To this end, the data driver 980 has a digital-to-analog converter (DAC) comprising a decoder for converting video data to a grayscale signal voltage and an operational amplifier for amplifying the grayscale signal voltage and outputting the amplified signal to the data line 962.

Progress is being made in raising the image quality (increasing the number of colors) in mobile telephone terminals, notebook personal computers, monitors and liquid crystal TV, etc. There is now growing demand for video data of at least six bits per each of R, G, B (260,000 colors) and even eight bits or more per each of R, G, B (26,800,000 colors). For this reason, a data driver that outputs a grayscale signal voltage corresponding to multiple-bit video data is required to provide a highly accurate output voltage conforming to the gray level along with a multiple-level grayscale voltage output.

In order to prevent degradation of the liquid crystal, the data driver is such that AC drive in which positive and negative voltages are applied alternatingly is performed with respect to voltage VCOM (see FIG. 11) of the opposing substrate electrode of the liquid crystal panel. The data driver therefore outputs grayscale voltage signals for positive-polarity and negative-polarity drive.

FIG. 12A is a diagram illustrating the relationship between applied voltage and transmittance in normally white liquid crystal. FIG. 12B is a diagram illustrating the relationship between grayscale levels of a liquid crystal device that drives liquid crystal having the characteristic of FIG. 12A and the output voltage of a data driver (voltage applied to the liquid crystal). With normally white liquid crystal, the transmittance of the liquid crystal declines as the voltage applied to the liquid crystal is increased. The output voltage of the data driver in case of positive polarity drive ranges from VCOM, which corresponds to the grayscale level 255 (eight bits), to high-side power-supply voltage VDD corresponding to grayscale level 0. In case of negative polarity drive, the output voltage of the data driver ranges from VCOM corresponding to level 255 to low-side power-supply voltage VSS corresponding to grayscale level 0. It is required that the data driver provide a highly accurate voltage output over the negative and positive-polarity output voltage range VSS to VDD.

FIG. 13 is a diagram illustrating the typical configuration of a differential amplifying circuit having a positive-polarity drive amplifier and a negative-polarity drive amplifier. As shown in FIG. 13, the differential amplifying circuit includes a changeover switch SW91 for switching an input terminal Vin between the input of a positive-polarity drive amplifier 910 and the input of a negative-polarity drive amplifier 920, and a changeover switch SW92 for switching an output terminal Vout between the output of the positive-polarity drive amplifier 910 and the output of the negative-polarity drive amplifier 920.

The positive-polarity drive amplifier 910 includes N-channel MOS transistors (referred to as "NMOS transistors") MN91 and MN92 having their sources coupled together and constructing a first differential pair; a constant current source I91 connected between the coupled sources of the NMOS transistors MN91 and MN92 and low-side power supply VSS; and P-channel MOS transistors (referred to as "PMOS transistors") MP93 and MP94 connected between drains of the NMOS transistors MN91 and MN92 and high-side power supply VDD and constructing a current mirror. The gates (a pair of inputs) of the NMOS transistors MN91 and MN92 are connected to the changeover switch SW92 on the output side and to the changeover switch SW91 on the input side, respectively.

The negative-polarity drive amplifier 920 includes PMOS transistors MP91 and MP92 having their sources coupled together and constructing a second differential pair; a constant current source I92 connected between the coupled sources of the PMOS transistors MP91 and MP92 and high-side power supply VDD; and NMOS transistors MN93 and MN94 connected between drains of the PMOS transistors MP91 and MP92 and low-side power supply VSS and constructing a current mirror. The gates (a pair of inputs) of the PMOS transistors MP91 and MP92 are connected to the changeover switch SW92 on the output side and to the changeover switch SW91 on the input side, respectively.

In AC drive for applying positive and negative voltages alternatingly with respect to voltage VCOM of the opposing substrate electrode (see 967 in FIG. 11), the positive-polarity drive amplifier 910 and negative-polarity drive amplifier 920 are connected between the input terminal Vin and output terminal Vout alternatingly, thereby driving the data lines of the liquid crystal display panel.

However, when drive is performed separately by the positive-polarity drive amplifier 910 and negative-polarity drive amplifier 920 in positive-polarity and negative-polarity AC drive, as in the circuit arrangement illustrated in FIG. 13, a variation in the characteristics of the transistors causes an increase in a deviation (referred to as "amplitude-difference deviation") between the driver outputs which is the difference in amplitudes between the positive-polarity output and negative-polarity output at the same grayscale level. Consequently, luminance unevenness, etc., occurs in the panel surface and image quality declines. This problem will be described below with reference to FIG. 9.

When viewed in terms of one cycle of positive-polarity and negative-polarity AC drive, luminance will take on a value approximately the same as the expected value if the amplitude difference between the positive-polarity and negative-polarity outputs at the same grayscale level does not change [see (A) of FIG. 9]. That is, if the deviation between the driver outputs which is the difference in amplitudes between the positive-polarity output and negative-polarity output at the same grayscale level is small, luminance at the same grayscale level will be uniform over the surface of the panel and the image quality will be high.

On the other hand, if the amplitude-difference deviation is large, the luminances of the positive-polarity output and negative-polarity output at the same grayscale level develop a variation on the panel surface and image quality declines.

At (B) and (C) of FIG. 9, the directions of an offset (output offset voltage) on positive and negative sides are the same. If the value of the offset is represented by $\Delta V$, the average luminance of one cycle will be the same as the expected value [(A) of FIG. 9]. That is, in case of (B) of FIG. 9, since the offset voltage $\Delta V$ on the positive side is a positive value and the potential difference between the positive-polarity output and VCOM increases, there is a rise in luminance. On the negative side, however, since the offset voltage $\Delta V$ is a positive value and the potential difference between the negative-polarity output and VCOM decreases, there is a decline in luminance. As a result, the average luminance of one cycle is the same as the expected value because the positive and negative sides cancel each other out.

By contrast, at (D) and (E) of FIG. 9, the directions of the offset on the positive and negative sides are opposite. Consequently, the average luminance of one cycle rises in (D) and declines in (E) in comparison with the expected value. This causes luminance unevenness. More specifically, in case of (D) of FIG. 9, the offset voltage $\Delta V$ on the positive side is a positive value and there is a rise in luminance, and the offset voltage $\Delta V$ on the negative side is a negative value and there is a rise in luminance; hence, the average luminance of one cycle rises. In case of (E) of FIG. 9, the offset voltage $\Delta V$ on the positive side is a negative value and there is a decline in luminance, and the offset voltage $\Delta V$ on the negative side is a positive value and there is a decline in luminance; hence, the average luminance of one cycle declines.

Since the differential amplifying circuit described with reference to FIG. 13 is driven by amplifiers of different polarities, namely positive and negative, the direction of the offset $\Delta V$ will not necessarily be the same in the positive- and negative-polarity drive amplifiers. This means that the states illustrated at (D) and (E) of FIG. 9 may occur.

FIG. 14 is a diagram illustrating the circuit arrangement of a conventional differential amplifier disclosed in Patent Document 1, which is cited below. As shown in FIG. 14, the differential amplifier can be considered upon being divided into an input stage 810, intermediate stage 820 and final stage 830.

The input stage 810 includes PMOS transistors MP80, MP81 and MP82 and NMOS transistors MN80, NMN81 and MN82.

The intermediate stage 820 includes PMOS transistors MP83, MP84, MP85, MP86, MP87 and MP88 and NMOS transistors MN83, NMN84, MN85, MN86, MN87 and MN88.

The final stage 830 includes a PMOS transistor MP89 and an NMOS transistor MN89.

The amplifier further includes phase compensating capacitors C81 and C82 between the intermediate stage 820 and the final stage 830.

The PMOS transistors MP81 and MP82 have their sources coupled together and construct a P-channel differential pair. The PMOS transistor MP80 is connected between this P-channel differential pair and a positive power supply VDD. The PMOS transistor MP80 has a source connected to the positive power supply VDD, a drain connected to the coupled sources of PMOS transistors MP81 and MP82 and a gate connected to a constant voltage source terminal BP81. The PMOS transistor MP80 acts as a constant current source.

The NMOS transistors MN81 and MN82 have their sources coupled together and construct an N-channel differential pair. The NMOS transistor MN80 is connected between this N-channel differential pair and a negative power supply VSS. The NMOS transistor MN80 has a source connected to the negative power supply VSS, a drain connected to the coupled sources of NMOS transistors MN81 and MN82 and a gate connected to a constant voltage source terminal BN81. The NMOS transistor MN80 acts as a constant current source.

The gate of the PMOS transistor MP81 and the gate of the NMOS transistor MN81 are connected to an input terminal INN. The gate of the PMOS transistor MP82 and the gate of the NMOS transistor MN82 are connected to an input terminal INP.

The drain of the PMOS transistor MP81 is connected to a node C of connection between the drain of the NMOS transistor MN83 and the source of the NMOS transistor MN85 in the intermediate stage 820.

The drain of the PMOS transistor MP82 is connected to a node D of connection between the drain of the NMOS transistor MN84 and the source of the NMOS transistor MN86.

The drain of the NMOS transistor MN81 is connected to a node A of connection between the drain of the PMOS transistor MP83 and the source of the PMOS transistor MP85.

The drain of the NMOS transistor MN82 is connected to a node B of connection between the drain of the PMOS transistor MP84 and the source of the PMOS transistor MP86.

The PMOS transistors MP83 and MP84 have their sources coupled together and their gates coupled together, and the coupled sources are connected to the positive power supply VDD. The drains of the PMOS transistors MP83 and MP84 are connected to the nodes A and B, respectively.

The PMOS transistor MP85 has its source connected to the node A and its drain connected to the coupled gates of the PMOS transistors MP83 and MP84, the source of the PMOS transistor MP87 and the drain of the NMOS transistor MN87.

The PMOS transistor MP86 has its source connected to the node B and its drain to the source of PMOS transistor MP88, the drain of NMOS transistor MN88 and the gate of the PMOS transistor MP89.

The gates of the PMOS transistors MP85 and MP86 are coupled together and connected to a constant voltage source terminal BP82.

The NMOS transistors MN83 and MN84 have their sources coupled together and their gates coupled together, and the coupled sources are connected to the negative power supply VSS.

The drains of the NMOS transistors MN83 and MN84 are connected to the nodes C and D, respectively.

The NMOS transistor MN85 has its source connected to the node C and its drain connected to the coupled gates of the NMOS transistors MN83 and MN84, the source of the NMOS transistor MN87 and the drain of the PMOS transistor MP87. The NMOS transistor MN86 has its source connected to the node D and its drain connected to the source of the NMOS transistor MN88, the drain of the PMOS transistor MP88 and the gate of the NMOS transistor MN89. The gates of the NMOS transistors MN85 and MN86 are coupled together and connected to a constant voltage source terminal BN82.

The PMOS transistor MP87 has its gate connected to a constant voltage source terminal BP83, it source connected to the drain of the PMOS transistor MP85 and its drain connected to the drain of the NMOS transistor MN85.

The NMOS transistor MN87 has its gate connected to a constant voltage source terminal BN83, its source connected to the drain of the NMOS transistor MN85 and its drain connected to the drain of the PMOS transistor MP85.

The PMOS transistor MP87 and NMOS transistor MN87 act as floating constant current sources.

The PMOS transistor MP88 has its gate connected to a constant voltage source terminal BP84, its source connected to the drain of the PMOS transistor MP86 and its drain connected to the drain of the NMOS transistor MN86.

The NMOS transistor MN88 has its gate connected to a constant voltage source terminal BN84, its source connected to the drain of the NMOS transistor MN86 and its drain connected to the drain of the PMOS transistor MP86.

The PMOS transistor MP88 and NMOS transistor MN88 act as floating constant current sources.

The PMOS transistor MP89 is an output transistor having a source connected to the positive power supply VDD, a gate connected to the source of the PMOS transistor MP88 and a drain connected to the output terminal OUT.

The NMOS transistor MN89 is an output transistor having a source connected to the negative power supply VSS, a gate connected to the source of the NMOS transistor MN88 and a drain connected to the output terminal OUT.

The phase compensating capacitor C81 has a first end connected to the node B and a second terminal connected to the output terminal OUT. The phase compensating capacitor C82 has a first end connected to the node D and a second terminal connected to the output terminal OUT.

The differential amplifier illustrated in FIG. 14 is a so-called "rail-to-rail amplifier" (a full-range amplifier). The input stage 810 is a differential stage obtained by bundling the PMOS-transistor differential pair and the NMOS-transistor differential pair in order to implement the rail-to-rail capability. Accordingly, it is necessary to couple the outputs of the PMOS-transistor differential pair and the outputs of the NMOS-transistor differential pair.

The outputs of the differential stage, therefore, are connected to the nodes A, B, C and D of a so-called folded-cascode connection. By virtue of this connection, the outputs of the PMOS-transistor differential pair and NMOS-transistor differential pair are coupled in terms of current.

According to this arrangement, the NMOS-transistor differential pair operates within an input-signal voltage range in which the PMOS-transistor differential pair does not operate.

Conversely, the PMOS-transistor differential pair operates within an input-signal voltage range in which the NMOS-transistor differential pair does not operate. As a result, it is possible to obtain an input stage that operates in the full input range of power supply voltages.

[Patent Document 1] Japanese Patent Kokai Publication No. JP-A-6-326529 (FIG. 1)

[Patent Document 2] Japanese Patent Kokai Publication No. JP-P2001-34234A (FIG. 5)

[Patent Document 3] Japanese Patent Kokai Publication No. JP-P2002-43944A (FIGS. 2 and 3)

[Patent Document 4] Japanese Patent Kokai Publication No. JP-P2005-130332A (FIGS. 1 and 26)

The conventional differential amplifying circuit described above with reference to FIGS. 13 and 14 has a certain problem, which is set forth below. The description of this problem is based upon the results of analysis by the present inventor.

FIG. 10A is a diagram useful in describing the amplitude-difference deviation (the deviation between the driver outputs which is the difference in amplitudes between the positive-polarity output and negative-polarity output at the same gray-scale level) of a data driver that uses the circuit of FIG. 13 as an output buffer. If the positive-polarity side and negative-polarity side are driven by separate amplifiers (see FIG. 13) in each output buffer, each driver output will take on any of the states shown at (B) to (E) of FIG. 9 owing to a variation in the characteristics of the transistors.

The amplitude-difference deviation therefore is very large across all grayscale levels. This means that luminance will vary (in display of the same grayscale level) across the surface of the panel (from data line to data line).

FIG. 10B is a diagram useful in describing the amplitude-difference deviation of a data driver that uses the circuit of FIG. 14 as an output buffer. If the positive-polarity side and negative-polarity side both are driven by a rail-to-rail amplifier in each output buffer, then, even though there is a variation in the transistor characteristics, the only states obtained are those at (B) and (C) of FIG. 9 in which the directions of positive-polarity and negative-polarity offsets agree owing to interaction between the P- and N-channel differential pairs in the grayscale region in which the P- and N-channel differential pairs both operate.

Consequently, there is little amplitude-difference deviation and image quality is excellent except near the grayscale level of 0.

However, in the vicinity of the 0 grayscale level, e.g., in a case where the voltage of the input signal is near VDD, the PMOS differential pair (MP81, MP82) turns off. On the other hand, in a case where the voltage of the input signal is near VSS, the NMOS differential pair (MN81, MN82) turns off. As a consequence, interaction between the PMOS differential pair and NMOS differential pair does not occur and the arbitrary states shown at (B) to (E) of FIG. 9 are the result. The result is a large amplitude-difference deviation in the vicinity of the 0 grayscale level [see FIG. 10B]. Even in the circuit of FIG. 14, therefore, luminance becomes non-uniform across the panel surface when a display near the 0 grayscale level is presented.

Although the case described above is one in which a normally white liquid crystal is driven, a similar problem occurs even in a case where a normally black liquid crystal is driven. That is, with a normally black liquid crystal, the characteristics of normally white liquid crystal shown in FIGS. 12A and 12B are reversed and the transmittance of the liquid crystal rises as the voltage applied to the liquid crystal is increased. Further, the driver for driving a normally black liquid crystal delivers a voltage output in the vicinity of the power-supply voltages VDD and VSS near the maximum grayscale level (255). Accordingly, there is a need to realize a differential amplifying circuit that suppresses amplitude-difference deviation over the full range of grayscale levels even in the vicinity of the power-supply voltages.

SUMMARY OF THE DISCLOSURE

The foregoing problems are solved by the present invention configured as follows.

A differential amplifying circuit according to a first aspect of the present invention, comprises:

a first differential pair of transistors of a first conductivity-type, having a pair of inputs for respectively receiving an input signal and a feedback signal which is fed back from an output terminal of said differential amplifying circuit;

a second differential pair of transistors of a second conductivity-type, having a pair of inputs for receiving at least one reference signal;

a first load circuit connected to a pair of outputs of said first differential pair;

a second load circuit connected to a pair of outputs of said second differential pair;

a coupling stage that is connected between said first and second load circuits, and couples outputs of said first and second differential pairs; and an amplifying stage that amplifies and outputs an output signal at said output terminal in accordance with outputs of said first and second differential pairs. The reference signal takes on any voltage that is capable of setting the second differential pair of transistors to an on-state.

In the present invention, it may be so arranged that the differential amplifying circuit further comprises:

a third differential pair of transistors of the first conductivity-type having a pair of outputs coupled together with the pair of outputs of said first differential pair;

a fourth differential pair of transistors of the second conductivity-type having a pair of outputs coupled together with the pair of outputs of said second differential pair;

wherein other input signals are respectively applied to a pair of inputs of said third differential pair; and another reference signals are respectively applied to a pair of inputs of said fourth differential pair.

A differential amplifying circuit according to a second aspect of the present invention, comprises:

a first differential pair of transistors of a first conductivity-type;

a second differential pair of transistors of a second conductivity-type;

a first load circuit connected to a pair of outputs of said first differential pair;

a second load circuit connected to a pair of outputs of said second differential pair;

a coupling stage that is connected between said first and second load circuits, and couples outputs of said first and second differential pairs;

an amplifying stage that amplifies and outputs an output signal at an output terminal of said differential amplifying circuit in accordance with outputs of said first and second differential pairs; and an input control circuit that controls changeover of signals supplied to pairs of inputs of said first and second differential pairs.

In the present invention, the input control circuit controls changeover between a first connection state in which an input terminal and said output terminal are connected to the pair of inputs of said first differential pair, respectively, and a first reference signal is supplied to the pair of inputs of said second differential pair, and a second connection state in which said input terminal and said output terminal are connected to the pair of inputs of said second differential pair, respectively, and a second reference signal is supplied to the pair of inputs of said first differential pair.

A differential amplifying circuit according to a third aspect of the present invention, comprises:

first to third input terminals;

an output terminal;

a first differential pair of transistors of a first conductivity-type;

a second differential pair of transistors of a second conductivity-type;

a third differential pair of transistors of the first conductivity-type having a pair of outputs coupled together with a pair of outputs of said first differential pair;

a fourth differential pair of transistors of the second conductivity-type having a pair of outputs coupled together with a pair of outputs of said second differential pair;

a first load circuit connected in common with outputs of said first and third differential pairs;

a second load circuit connected in common with outputs of said second and fourth differential pairs;

a coupling stage connected between said first and second load circuits;

an amplifying stage that amplifies and outputs an output signal at said output terminal in accordance with outputs of said first and third differential pairs and outputs of said second and fourth differential pairs; and an input control circuit that controls changeover of signals supplied to pairs of inputs of said first and third differential pairs and to pairs of inputs of said second and fourth differential pairs.

In the present invention, the input control circuit controls changeover between a first connection state in which said first input terminal and said output terminal are connected to the pair of inputs of said first differential pair, respectively, said second and third input terminals are connected to the pair of inputs of said third differential pair, respectively, and first and second reference signals are supplied to the pair of inputs of said second and fourth differential pairs, respectively; and a second connection state in which said first input terminal and said output terminal are connected to the pair of inputs of said second differential pair, respectively, said second and third input terminals are connected to the pair of inputs of said fourth differential pair, respectively and third and fourth reference signals are supplied to the pair of inputs of said first and third differential pairs, respectively.

The present invention further provides a differential amplifying circuit including:

a first differential pair of transistors of a first conductivity-type; and a second differential pair of transistors of a second conductivity-type;

the outputs of the first and second differential pairs being coupled by a coupling stage;

said differential amplifying circuit receiving an input signal which is allowed to take on a range of voltages that include high-potential-side and low-potential-side power-supply voltages as a first input, and outputting an output signal corresponding to said input signal, with said output signal being fed back and applied as a second input;

a pair of inputs of one of the differential pairs of said first and second differential pairs being supplied with said input signal and said output signal as the first and second inputs, and a pair of inputs of the other differential pair of said first and second differential pairs being supplied with respective ones of bias voltages that set said other differential pair of transistors to an on-state.

According to another aspect of the present invention, there is provided a data driver comprising: a grayscale voltage generating circuit for generating a plurality of grayscale voltages; a decoder circuit for selecting at least one grayscale voltage from the grayscale voltage generating circuit based upon an input video signal; and a buffer circuit for receiving an output of the decoder circuit and driving data line, wherein the buffer circuit comprises the above-described differential amplifying circuit according to the present invention.

In the present invention, a deviation (amplitude-difference deviation) between the driver outputs which is the difference in amplitudes between the positive-polarity output and negative-polarity output at the same grayscale level is made freely reducible uniformly over the full grayscale range.

A display device according to the present invention has the data driver described above.

The meritorious effects of the present invention are summarized as follows.

In accordance with a differential amplifying circuit of the present invention, differential pairs for positive-polarity and negative-polarity drive are turned on even when the differential amplifying circuit is driven by an input signal voltage in the vicinity of power-supply voltage. As a result, interaction is brought about by coupling and the amplitude-difference deviation can be kept low.

In accordance with a data driver or display device according to the present invention, amplitude-difference deviation can be kept low, thereby making it possible to suppress the occurrence of luminance unevenness across the panel surface and to improve image quality.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 is a diagram illustrating an example of control of switches in an input control circuit according to the third example;

FIG. 7 is a diagram illustrating an example of control of switches in an input control circuit according to the fifth example;

DETAILED DESCRIPTION OF THE INVENTION

Exemplary embodiments of the present invention will be described with reference to the drawings.

Figure 1:
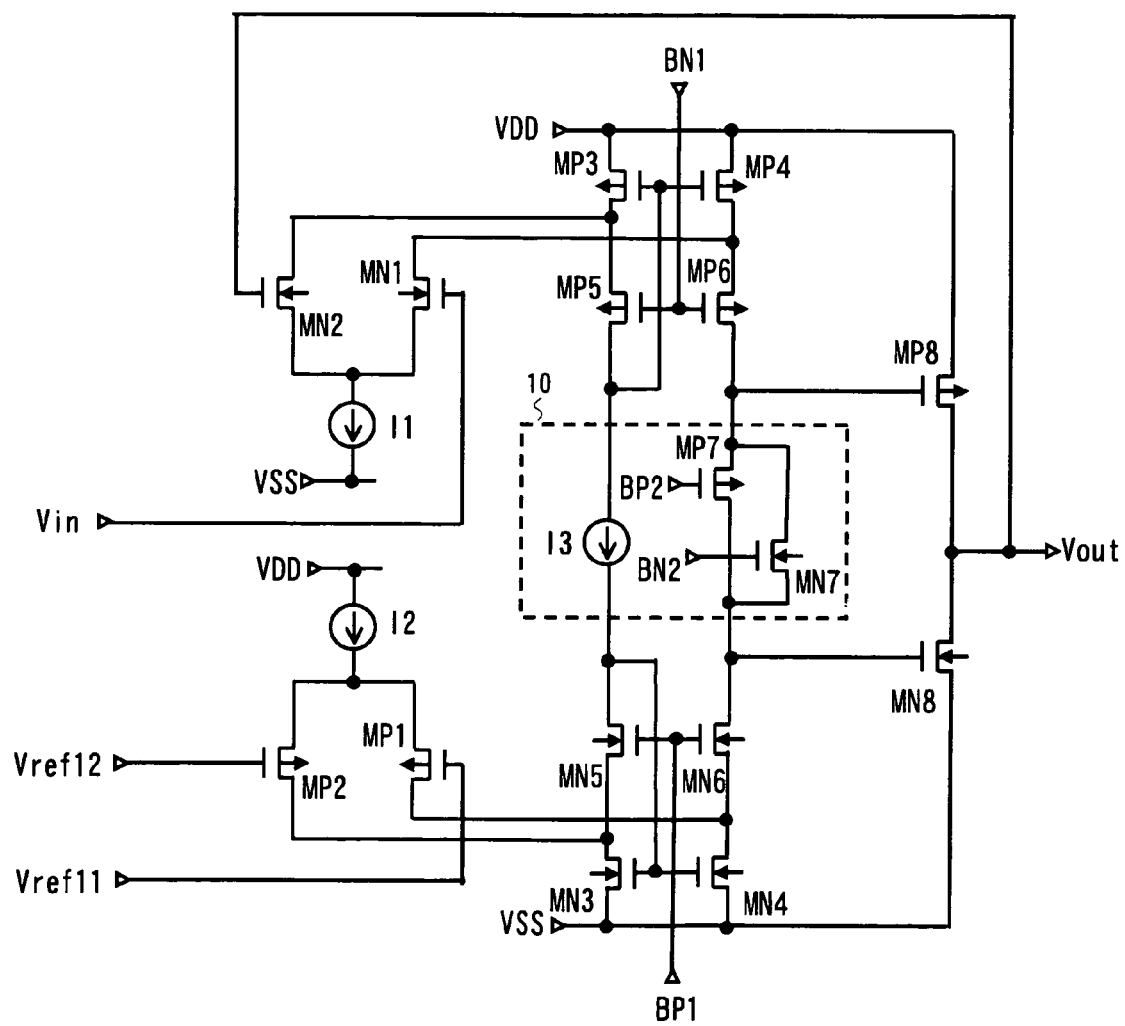
FIGS. 1 to 3 are diagrams respectively illustrating the structures of first to third examples according to the present invention.

As shown in FIG. 1, a differential amplifying circuit according to the present invention includes first and second differential pairs (MN1, MN2) and (MP1, MP2) having mutually different conductivity-types (polarities). The differential amplifying circuit is adapted to receive an input signal Vin which is allowed to take on a range of voltages that include power-supply voltages VDD and VSS on the high- and low-potential sides, respectively, at a non-inverting input terminal, and output an output signal Vout corresponding to the input signal Vin, with the output signal Vout being fed back and applied to an inverting input terminal. A pair of inputs of one of the differential pairs of the first and second differential pairs (MN1, MN2) and (MP1, MP2) are respectively supplied with the input signal Vin and output signal Vout and a pair of inputs of the other differential pair of the first and second differential pairs are respectively supplied with bias voltages Vref11 and Vref12 which set the transistors of the other differential pair to an on-state. The bias voltages Vref11 and Vref12 may be made the same voltage, referred to as voltage Vref1.

In the present invention, first and second load circuits connected to pairs of outputs of the first and second differential pairs are implemented by, e.g., cascode current mirror circuits, and a coupling stage comprising a current source for coupling the first and second load circuits is provided.

In the present invention, the differential amplifying circuit may include a circuit 20 (see FIG. 3) for controlling changeover between a state in which a pair of inputs of one of the differential pairs of the first and second differential pairs (MN1, MN2) and (MP1, MP2), are supplied with the input signal Vin and output signal Vout, respectively, and a pair of inputs of the other differential pair of the first and second differential pairs are supplied with a bias voltage Vref1 that sets the transistors of the other differential pair to an on-state, and a state in which the pair of inputs of the one differential pair are supplied with a bias voltage Vref2 that sets transistors of the one differential pair to an on-state and the pair of inputs of the other differential pair are supplied with the input signal Vin and output signal Vout, respectively. The first and second differential pairs for positive-polarity and negative-polarity drive are turned on when the voltage of the input signal is in the vicinity of the power-supply voltage VDD on the high-potential side and also when the input signal is in the vicinity of the power-supply voltage VSS on the low-potential side. Consequently, as a result of interaction between the first and second differential pairs, the positive-polarity and negative-polarity offsets in the respective first and second differential pairs have the same direction and the amplitude-difference deviation can be kept low over the full range of grayscale levels. By adopting the differential amplifying circuit of the present invention as a buffer circuit in a data driver for driving the data lines of a display panel, the occurrence of luminance irregularity across the panel surface can be suppressed and image quality can be improved. Examples of the invention will now be described in detail.

Figure 14:
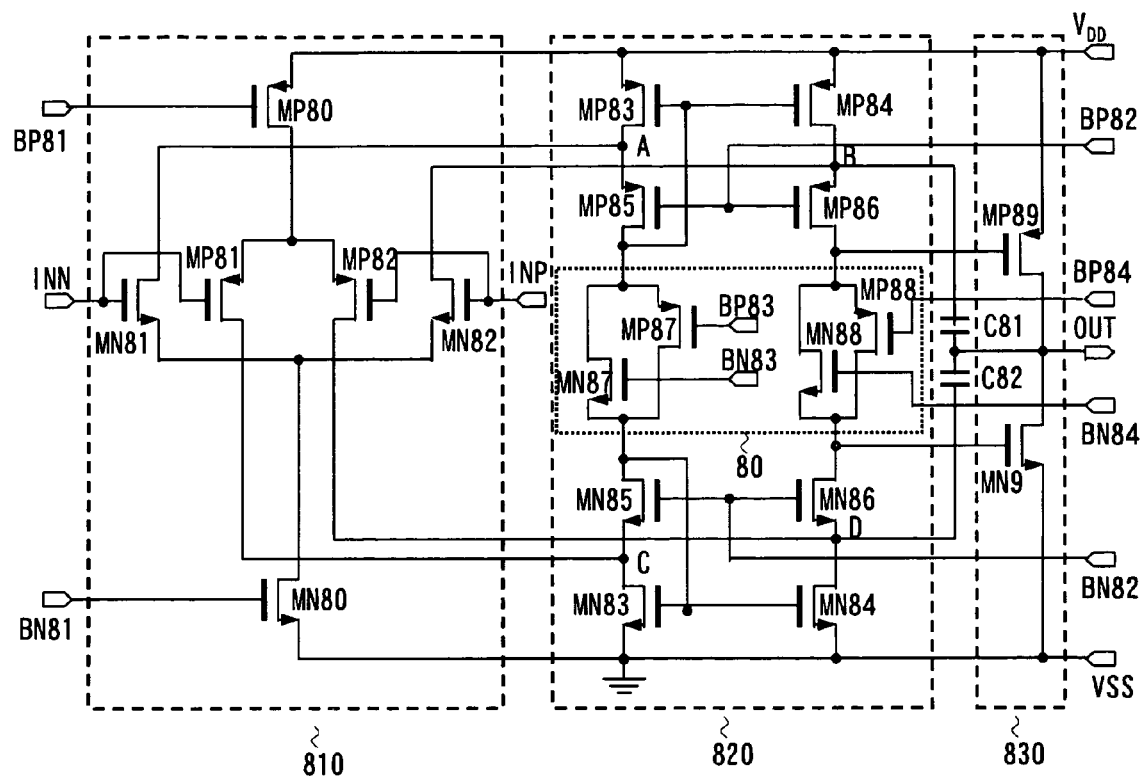
FIG. 14 is a diagram illustrating the configuration of a differential amplifying circuit described in the Patent Document 1.

FIG. 1 is a diagram illustrating the configuration of a first example of the present invention. As illustrated in FIG. 1, this example is constructed by connecting an input terminal Vin and an output terminal Vout respectively to the a pair of inputs (gates) of the NMOS differential pair in the differential amplifying circuit (the rail-to-rail differential amplifying circuit) shown in FIG. 14, and supplying reference voltages Vref11 and Vref12 respectively to a pair of inputs (gates) of the PMOS differential pair. The reference voltages Vref11 and Vref12 are made voltages that render the output voltage Vout stable with respect to the input voltage Vin. If these reference voltages have levels that will set the differential pair transistors MP1 and MP2 to an on-state, they may be made any voltages inclusive of identical voltages (e.g., they may also be made the power-supply voltage VSS on the low-potential side).

More specifically, as illustrated in FIG. 1, the differential amplifying circuit according to this example has an input differential stage that includes NMOS transistors MN1 and MN2 which have their sources coupled together and constitute a first differential pair; a first constant current source I1 which is connected between the coupled sources of the NMOS transistors MN1 and MN2 and low-potential-side power supply VSS; P-channel MOS transistors MP1 and MP2 which have their sources coupled together and constitute a second differential pair; and a second constant current source I2 which is connected between the coupled sources of the PMOS transistors MP1 and MP2 and high-potential-side power supply VDD. The gates (a pair of inputs) of the NMOS transistors MN1 and MN2 that constitute the first differential pair are connected to the input terminal Vin and output terminal Vout, respectively. The gates (a pair of inputs) of the PMOS transistors MP1 and MP2 that constitute the second differential pair are connected to reference voltages Vref11 and Vref12, respectively.

The load circuit of the first differential pair (MN1, MN2) has a first cascode current mirror circuit. The first cascode current mirror circuit includes a PMOS transistor MP3 which has a source connected to the power supply VDD on the high potential side; a PMOS transistor MP4 which has a source connected to the power supply VDD on the high potential side and a gate connected to the gate of the PMOS transistor MP3; a PMOS transistor MP5 which has a source connected to the drain of the PMOS transistor MP3; and a PMOS transistor MP6 which has a source connected to the drain of the PMOS transistor MP4 and a gate connected to the gate of the PMOS transistor MP5. The drain of the PMOS transistor MP5 is connected to the coupled gates of the PMOS transistors MP3 and MP4. The drains of the PMOS transistors MP5 and MP6 form the input and output ends, respectively, of the first cascode current mirror circuit. The coupled gates of the PMOS transistors MP5 and MP6 are connected to a bias terminal BN1.

The drain of one transistor MN1 constituting the first differential pair is connected to the node of a connection between the source of the transistor MP4 and the drain of the transistor MP6. The drain of the other transistor MN2 constituting the first differential pair is connected to the node of a connection between the source of the transistor MP3 and the drain of the transistor MP5.

A second cascode current mirror that forms the load circuit of the second differential pair (MP1, MP2) includes an NMOS transistor MN3 which has a source connected to the power supply VSS on the low potential side; an NMOS transistor MN4 which has a source connected to the power supply VSS on the low potential side and a gate connected to the gate of the NMOS transistor MN3; an NMOS transistor MN5 which has a source connected to the drain of the NMOS transistor MN3; and a NMOS transistor MN6 which has a source connected to the drain of the NMOS transistor MN4 and a gate connected to the gate of the NMOS transistor MN5.

The drain of the NMOS transistor MN5 is connected to the coupled gates of the NMOS transistors MN3 and MN4. The drains of the NMOS transistors MN5 and MN6 form the input and output ends, respectively, of the second cascode current mirror circuit. The coupled gates of the NMOS transistors MN5 and MN6 are connected to a bias terminal BP1.

The drain of one transistor MP1 constituting the second differential pair is connected to the node of a connection between the source of the transistor MN4 and the drain of the transistor MN6. The drain of the other transistor MP2 constituting the second differential pair is connected to the node of a connection between the source of the transistor MN3 and the drain of the transistor MN5.

A coupling stage 10 is provided between the first and second cascode current mirror circuits. The coupling stage 10 includes a current source 13 connected between the drain of PMOS transistor MP5 and the drain of NMOS transistor MN5, and transistors MP7 and MN7 connected in parallel between the drain of PMOS transistor MP6 and the drain of NMOS transistor MN6. A bias voltage BP2 is supplied to the gate of transistor MP7, and a bias voltage BN2 is supplied to the gate of NMOS transistor MN7.

An output amplifying stage includes a PMOS transistor MP8 (a transistor for charging drive) which has a source connected to the power supply VDD, a drain connected to the output terminal Vout and a gate connected to the drain of PMOS transistor MP6; and an NMOS transistor MN8 (a transistor for discharging drive) which has a source connected to the power supply VSS, a drain connected to the output terminal Vout and a gate connected to the drain of NMOS transistor MN6.

In accordance with this example, the second differential pair (MP1, MP2) is biased by Vref11 and Vref12 and will not turn off even in a case where signal voltage applied to the input terminal Vin is in the vicinity of the power-supply voltage VDD on the high-potential side.

Figure 10A:
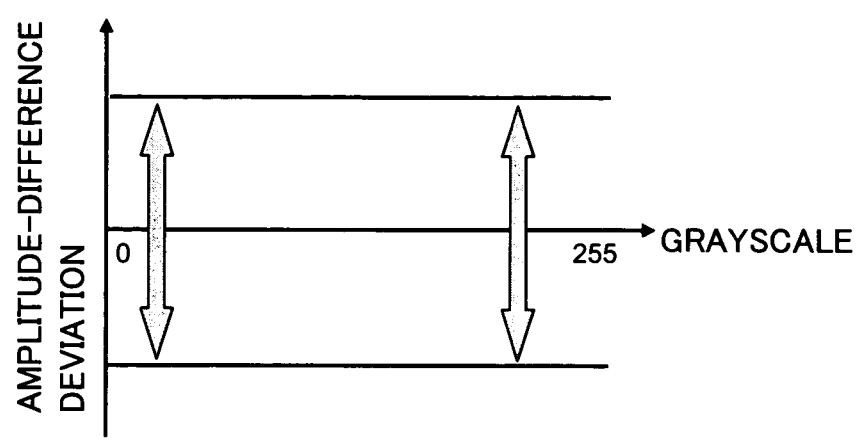
FIGS. 10A and 10B are diagrams useful in describing amplitude-difference deviation of circuits shown in FIGS. 13 and 14, respectively.
Figure 10B:
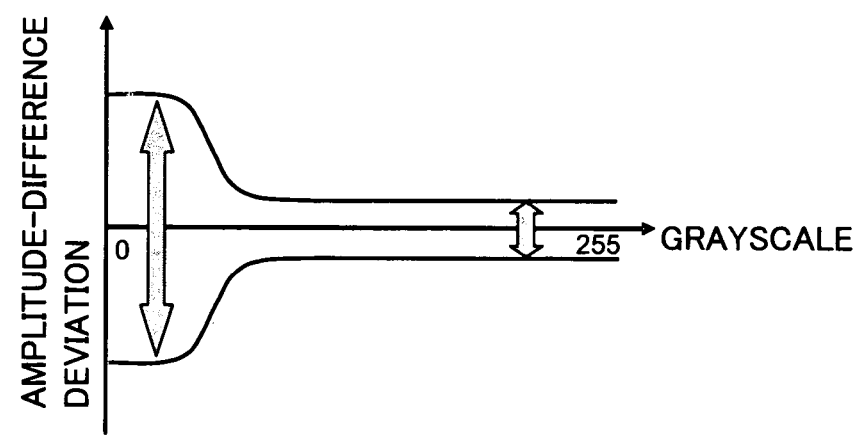
Figure 11:
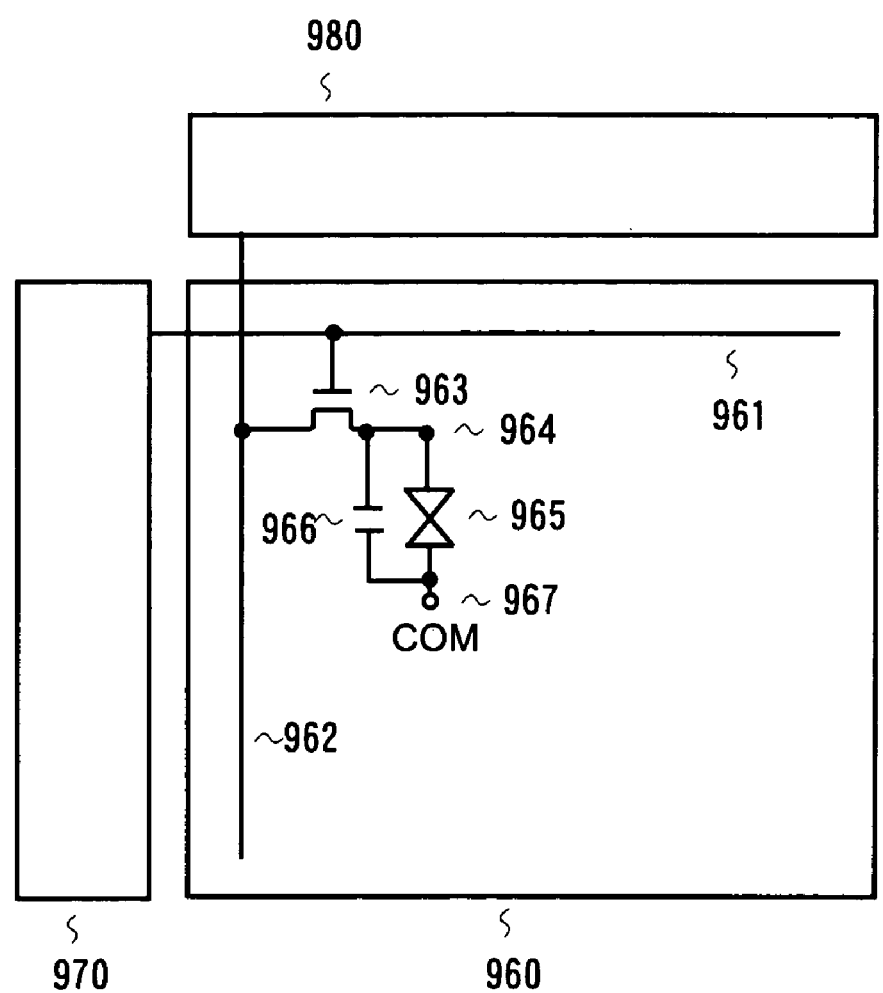
FIG. 11 is a diagram illustrating the configuration of a liquid crystal display device.
Figure 12A:
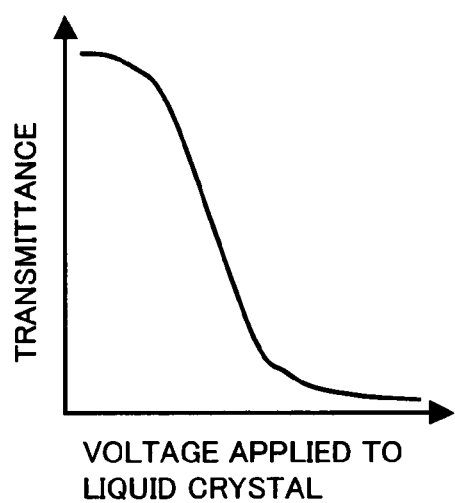
FIG. 12A is a diagram exemplifying the relationship between applied voltage and transmittance in normally white liquid crystal.
Figure 12B:
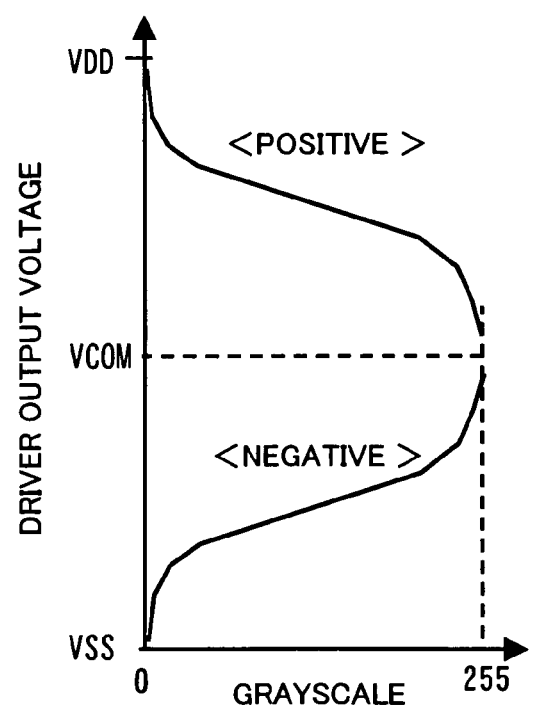
FIG. 12B is a diagram exemplifying the relationship between grayscale levels and driver output.
Figure 13:
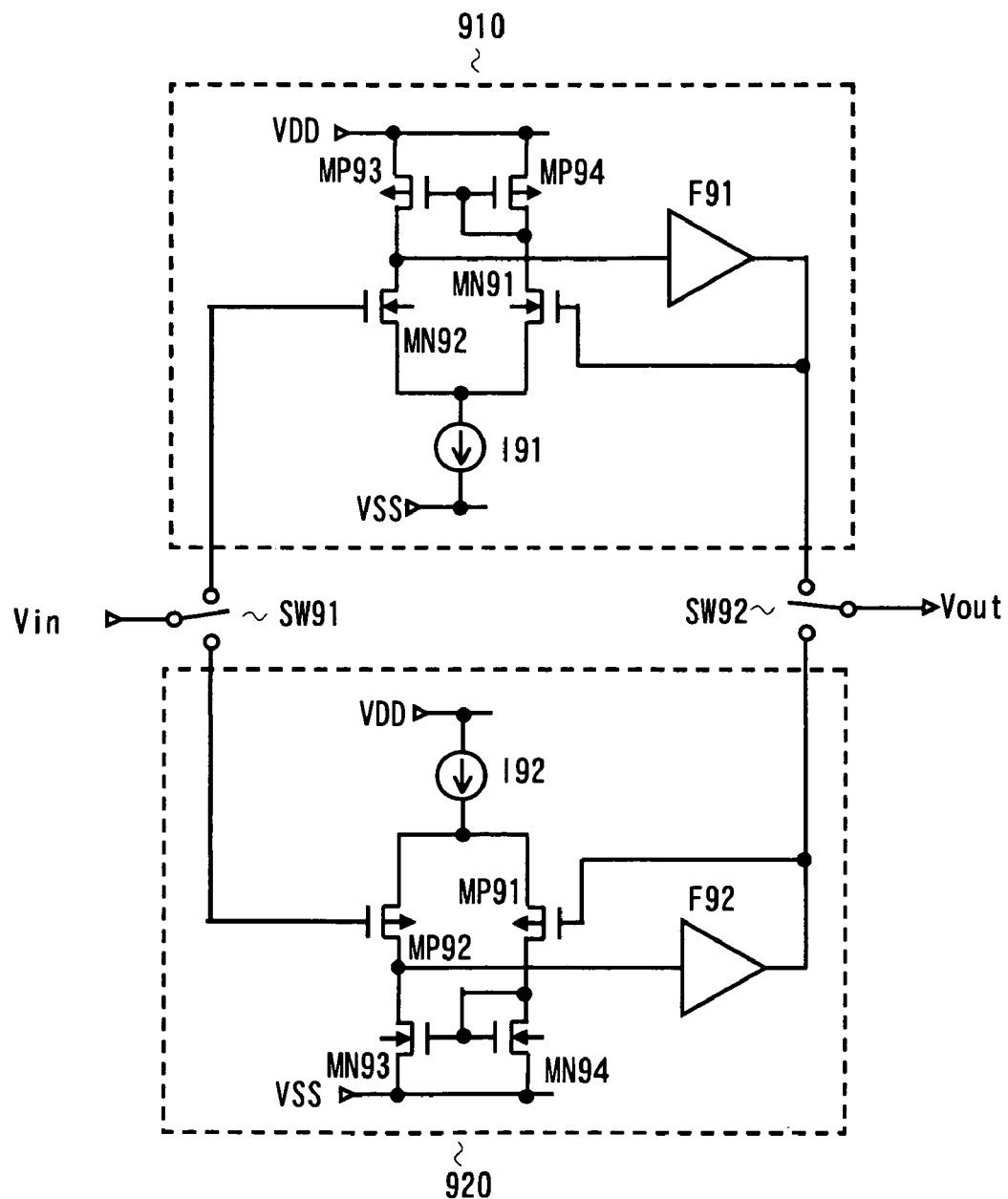
FIG. 13 is a diagram illustrating the configuration of a typical rail-to-rail differential amplifying circuit according to the conventional art.

With the above-described arrangement of the conventional art (see FIG. 14) in which the non-inverting input terminal of the second differential pair (MP81, MP82) receives the input signal Vin, if the PMOS transistor MP81 turns off and the output signal Vout is fed back to the inverting input terminal with the signal voltage of input signal Vin in the vicinity of the power-supply voltage VDD, the PMOS transistor MP82 will turn off as well. In this case, the amplitude-difference deviation in the vicinity of the power-supply voltage VDD increases [see FIG. 10B].

By contrast, in accordance with this example, the second differential pair (MP1, MP2) does not turn off and interaction is produced between the first and second differential pairs even in a case where signal voltage applied to the input terminal Vin is in the vicinity of the power-supply voltage VDD on the high-potential side. As a result, an increase in offset in the vicinity of the power-supply voltage VDD can be prevented.

In this example, the gates of the second differential pair transistors (MP1, MP2) are supplied with respective ones of the two bias voltages Vref11 and Vref12. However, it may be so arranged that these gates are each supplied with the same voltage. Usually, in a case where the sizes such as W/L ratio (channel width/channel length) of differential pair transistors are the same, the gates of the differential pair transistors receive the same voltage. However, it may be so arranged that in a case where a prescribed correction value is applied or a case where the W/L ratios of the differential pair transistors are different, the gates of the differential pair are supplied with mutually different voltages.

This example is applicable to any amplifier in which the outputs of two differential pairs having mutually different polarities (conductivity types) are coupled by the coupling stage 10. The configuration in which the two differential pairs having mutually different polarities (conductivity types) produce an interaction over the full operating range inclusive of voltage in the vicinity of power-supply voltage is one important feature of the present invention.

In the first example set forth above, the implementation described is one in which the gates of the second differential pair transistors MP1 and MP2 on the side of negative polarity drive are supplied with respective ones of the reference voltages Vref11 and Vref12 whose levels set the second differential pair transistors to an on-state. However, it is of course permissible to adopt an implementation in which the gates of the first differential pair transistors MN1 and MN2 on the side of positive polarity drive are supplied with respective ones of reference voltages whose levels set the first differential pair transistors to an on-state. Further, it may be so arranged that changeover of these inputs is carried out. Second and third examples will be described below.

Figure 2:
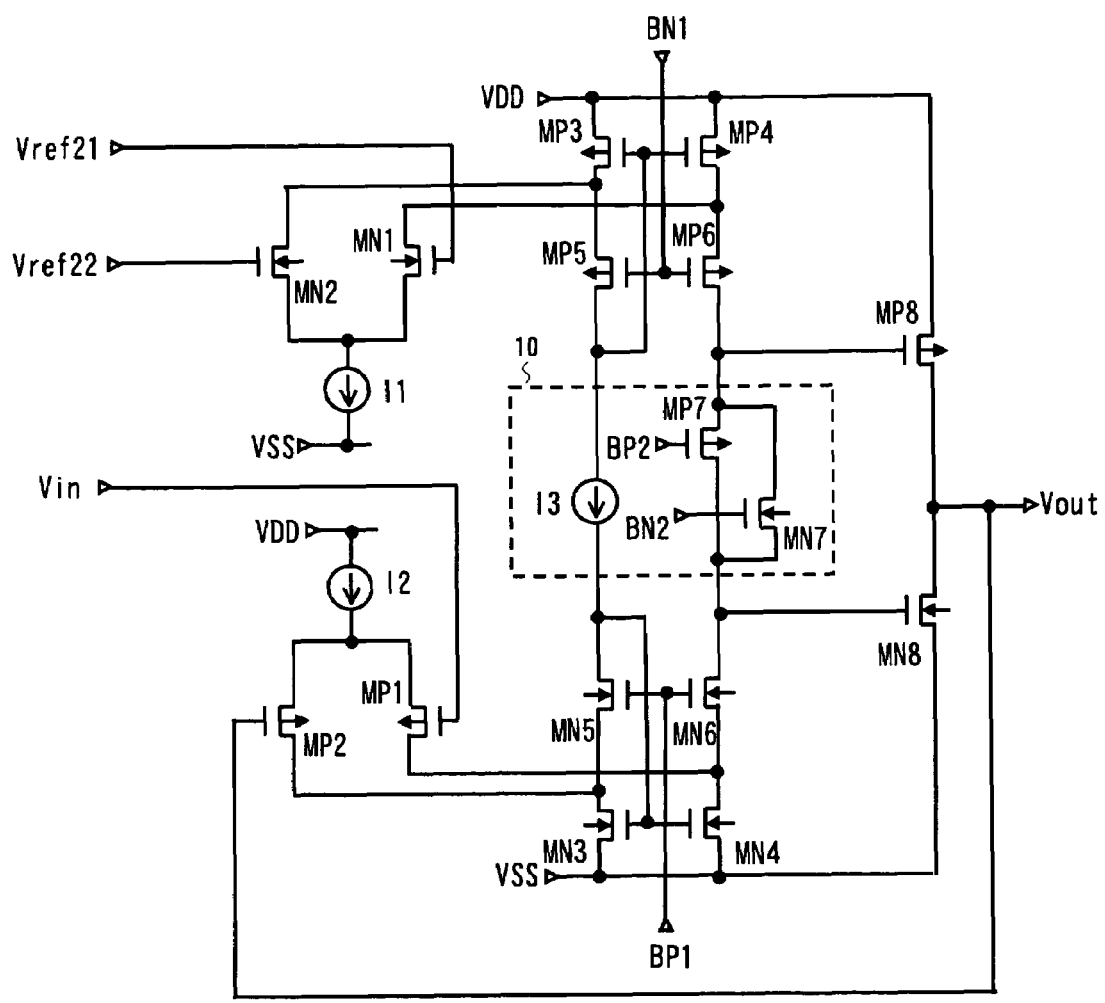

The second example will be described next. FIG. 2 is a diagram illustrating the configuration of the second example of the present invention. As illustrated in FIG. 2, this example is constructed by connecting gates of the PMOS differential-pair transistors MP1 and MP2 to the input terminal Vin and output terminal Vout, respectively, and supplying the gates of the NMOS differential-pair transistors MN1 and MN2 with reference voltages Vref21 and Vref22, respectively. Conversely with respect to the example shown in FIG. 1, this example is such that even if the signal voltage at the input terminal Vin is in the vicinity of the power-supply voltage VSS, the first differential pair (MN1, MN2) will not turn off and an increase in offset can be prevented.

The differential amplifying circuit includes NMOS transistors MN1 and MN2 which have sources coupled together and constitute a first differential pair; a first constant current source I1 which is connected between the coupled sources of the NMOS transistors MN1 and MN2 and low-potential-side power supply VSS; P-channel MOS transistors MP1 and MP2 which have sources coupled together and constitute a second differential pair; and a second constant current source I2 which is connected between the coupled sources of the PMOS transistors MP1 and MP2 and high-potential-side power supply VDD. The gates of the NMOS transistors MN1 and MN2 that constitute the first differential pair are connected to Vref21 and Vref22, respectively. The gates of PMOS transistors MP1 and MP2 that constitute the second differential pair are connected to input terminal Vin and output terminal Vout, respectively. The reference voltages Vref21 and Vref22 are made voltages that render the output voltage Vout stable with respect to the input voltage Vin. If these reference voltages have levels that will turn on the first differential pair transistors (MN1, MN2), they may be made any voltages inclusive of identical voltages (e.g., they may also be made the power-supply voltage VDD on high low-potential side). Further, if the reference voltages Vref21 and Vref22 fall within the above-mentioned range of voltages, then common voltage values may be adopted for these voltages and the reference voltages Vref11 and Vref12 in FIG. 1.

The structures of the cascode current mirror circuit (MP3, MP4, MP5, MP6), cascode current mirror circuit (MN3, MN4, MN5, MN6), coupling stage 10 and amplifying stage (MP8, MN8) are identical with those of the first example described above.

Figure 3:
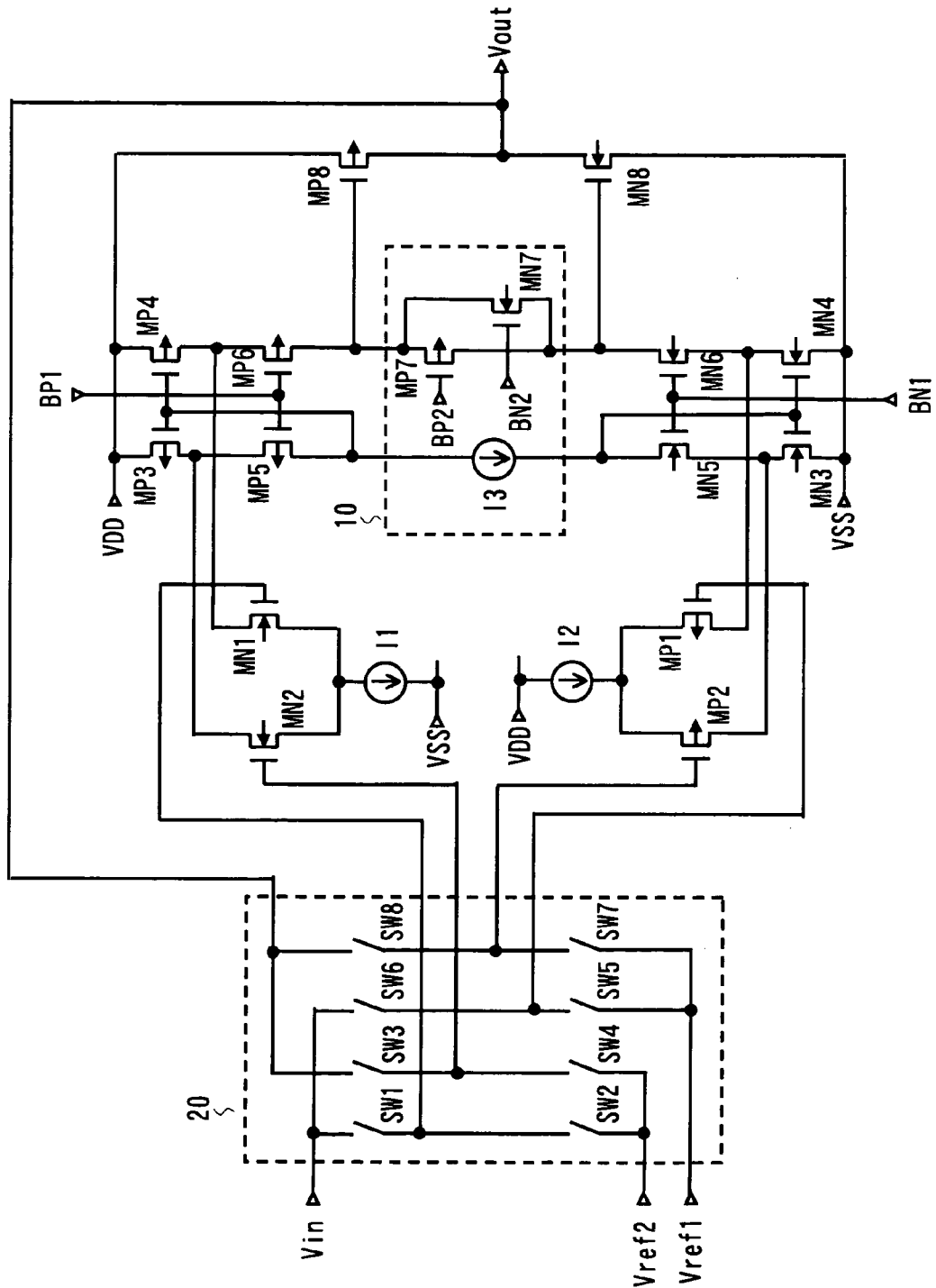

A third example of the present invention will be described next. FIG. 3 is a diagram illustrating the configuration of the third example of the present invention. FIG. 3 illustrates a case where the bias voltages supplied to the gates of respective transistors of the transistor pair constructing the differential pair are the same. As shown in FIG. 3, this example has an input control circuit (also referred to as an "input changeover circuit") 20 so that it is possible to freely switch between the connection configuration of FIG. 1 and the connection configuration of FIG. 2. More specifically, the input control circuit 20 includes switches SW1 and SW2 for performing changeover so as to connect the gate of NMOS transistor MN1 constituting the first differential pair to the input terminal Vin or voltage Vref2 (Vref21), and switches SW3 and SW4 for performing changeover so as to connect the gate of NMOS transistor MN2 constituting the first differential pair to the output terminal Vout or voltage Vref2 (Vref22).

The input control circuit 20 further includes switches SW5 and SW6 for performing changeover so as to connect the gate of NMOS transistor MP1 constituting the second differential pair to voltage Vref11 (Vref11) or input terminal Vin, and switches SW7 and SW8 for performing changeover so as to connect the gate of NMOS transistor MP2 constituting the second differential pair to the voltage Vref11 (Vref12) or output terminal Vout.

The structures of the cascode current mirror circuit (MP3, MP4, MP5, MP6), cascode current mirror circuit (MN3, MN4, MN5, MN6), coupling stage 10 and amplifying stage (MP8, MN8) are identical with those of the first example described above and need not be described again.

FIG. 4 is a diagram useful in describing ON/OFF control of the switches SW1 to SW8 of FIG. 3. At the time of positive polarity drive, the switches SW1, SW3, SW5 and SW7 are turned on and the switches SW2, SW4, SW6 and SW8 are turned off. As a result, the gates of the first differential pair (MN1, MN2) are connected to respective ones of the input terminal Vin and output terminal Vout, and the gates of the second differential pair (MP1, MP2) are supplied with reference voltage Vref11, whereby the connection configuration of FIG. 1 is obtained. At the time of negative polarity drive, the switches SW2, SW4, SW6 and SW8 are turned on and the switches SW1, SW3, SW5 and SW7 are turned off. As a result, the gates of the second differential pair (MP1, MP2) are connected to respective ones of the input terminal Vin and output terminal Vout, and the gates of the first differential pair (MN1, MN2) are supplied with reference voltage Vref2, whereby the connection configuration of FIG. 2 is obtained.

By virtue of such an arrangement, the differential amplifying circuit of FIG. 3 is such that the first and second differential pairs are turned on both when the input signal Vin is in the vicinity of power-supply voltage VDD on the high-potential side and when it is in the vicinity of power-supply voltage VSS on the low-potential side. Owing to the resulting interaction between the first and second differential pairs, the directions of offset in positive polarity drive and negative polarity drive can be made to agree. Although there are also cases in changeover between positive-polarity and negative-polarity drive where a small difference develops in the offset amount, the amplitude-difference deviation can for the most part be kept small over the full grayscale range.

Figure 5:
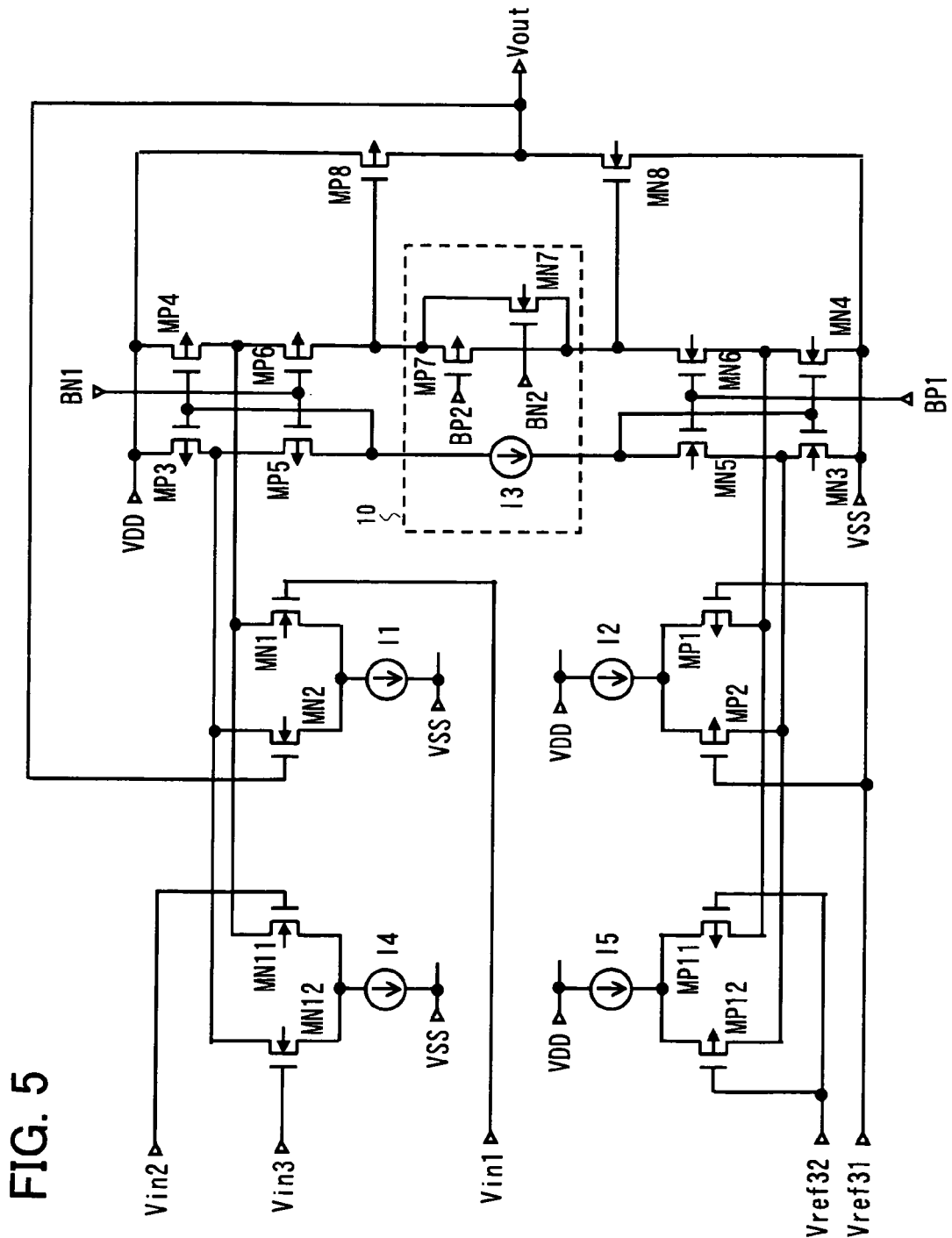
FIGS. 5 and 6 are diagrams respectively illustrating the structures of fourth and fifth examples according to the present invention.

A fourth example of the present invention will be described next. FIG. 5 is a diagram illustrating the configuration of the fourth example of the present invention. This example has multiple differential pairs of the same polarity. It should be noted that a variety of differential amplifiers having multiple differential pairs have been proposed. Patent Document 2 [Japanese Patent Kokai Publication No. JP-P2001-34234A (FIG. 5)] and Patent Document 3 [Japanese Patent Kokai Publication No. JP-P2002-43944A (FIGS. 2 and 3)] disclose arrangements in which the inverting input terminals of a plurality of differential pairs are all feedback-connected to an output terminal. Patent Document 4 [Japanese Patent Kokai Publication No. JP-P2005-130332A (FIGS. 1 and 26)] discloses an arrangement in which one of the inverting input terminals of a plurality of differential pairs is feedback-connected and the others are supplied with prescribed signals. FIG. 5 illustrates an expansion to a differential amplifying circuit obtained by adding differential pairs to the differential amplifying circuit of FIG. 1. That is, this differential amplifying circuit has two differential pairs of the same (positive) polarity (conductivity type) that share the same load circuit and two differential pairs of the same (negative) polarity (conductivity type) that share the same load circuit. As for the bias voltages (reference voltages), the arrangement illustrated is one in which the same bias voltage is supplied to each of the gates of the pair of transistors constituting the differential pair. Further, a differential amplifying circuit having three or more differential pairs of the same polarity (conductivity type) may be obtained by performing an expansion similar to that shown in FIG. 5.

The structures of the cascode current mirror circuit (MP3, MP4, MP5, MP6), cascode current mirror circuit (MN3, MN4, MN5, MN6), coupling stage 10 and amplifying stage (MP8, MN8) are identical with those of the first example set forth above and need not be described again.

The differential amplifying circuit of this example has two NMOS differential pairs (MN1, MN2) and (MN11, MN12), which share the same load circuit, as an input differential stage. The gates of the differential pair transistors MN1 and MN2 are supplied with Vin1 and Vout, respectively, and the gates of the differential pair transistors MN11 and MN12 are supplied with Vin2 and Vin3, respectively. Further, the differential amplifying circuit has two PMOS differential pairs (MP1, MP2) and (MP11, MP12), which share the same load circuit, as the input differential stage. The gates of the differential pair transistors MP1 and MP2 are supplied with reference voltage Vref31, and the gates of the differential pair transistors MP11 and MP12 are supplied with reference voltage Vref32.

More specifically, the differential amplifying circuit includes NMOS transistors MN1 and MN2 which have sources coupled together and connected to current source I1 and constitute a first NMOS differential pair; and NMOS transistors MN11 and MN12 which have sources coupled together and connected to current source I4 and constitute a second NMOS differential pair.

The gates of NMOS transistors MN1 and MN2 are connected to input terminal Vin1 and output terminal Vout, respectively. The gates of NMOS transistors MN11 and MN12 are connected to input terminal Vin2 and input terminal Vin3, respectively. The drains of NMOS transistor MN1 and NMOS transistor MN11 are coupled together and connected to a node of connection between the drain of PMOS transistor MP4 and the source of PMOS transistor MP6. The drains of NMOS transistor MN2 and NMOS transistor MN12 are coupled together and connected to a node of connection between the drain of PMOS transistor MP3 and the source of PMOS transistor MP5.

The differential amplifying circuit further includes PMOS transistors MP1 and MP2 which have sources coupled together and connected to current source I2 and constitute a first PMOS differential pair; and PMOS transistors MP11 and MP12 which have sources coupled together and connected to current source I3 and constitute a second PMOS differential pair. The bias voltages Vref31 and Vref32 may be made the same voltage.

The drains of PMOS transistor MP1 and PMOS transistor MP11 are coupled together and connected to a node of connection between the drain of NMOS transistor MN4 and the source of NMOS transistor MN6. The drains of PMOS transistor MP2 and PMOS transistor MP12 are coupled together and connected to a node of connection between the drain of NMOS transistor MN3 and the source of NMOS transistor MN5.

The output terminal voltage Vout is (Vin1+Vin2−Vin3). If we assume that Vin1=Vin2 holds, then Vout will be a voltage (2Vin1−Vin3) that externally divides Vin1 and Vin3, as described in Patent Document 4. If we assume that Vin3=Vout holds, then Vout will be a voltage [(Vin1+Vin2)/2] that internally divides Vin1 and Vin2, as described in Patent Document 2.

It is also possible to adopt an implementation in which differential pairs are added onto the arrangement of FIG. 2 in a manner similar to the above case where the implementation of FIG. 5 is obtained by adding differential pairs onto the arrangement of FIG. 1. In such case the implementation would have the input terminal Vin1 and the output terminal Vout connected to the gates of transistors MP1, MP2, respectively, of the differential pair (MP1, MP2), the voltages Vin2, Vin3 connected to the gates of transistors MP11, MP12, respectively, of the differential pair (MP11, MP12), and prescribed bias voltages supplied to the gates of differential pairs (MN1, MN2) and (MN11, MN12). The output terminal voltage would be (Vin1+Vin2−Vin3).

Figure 6:
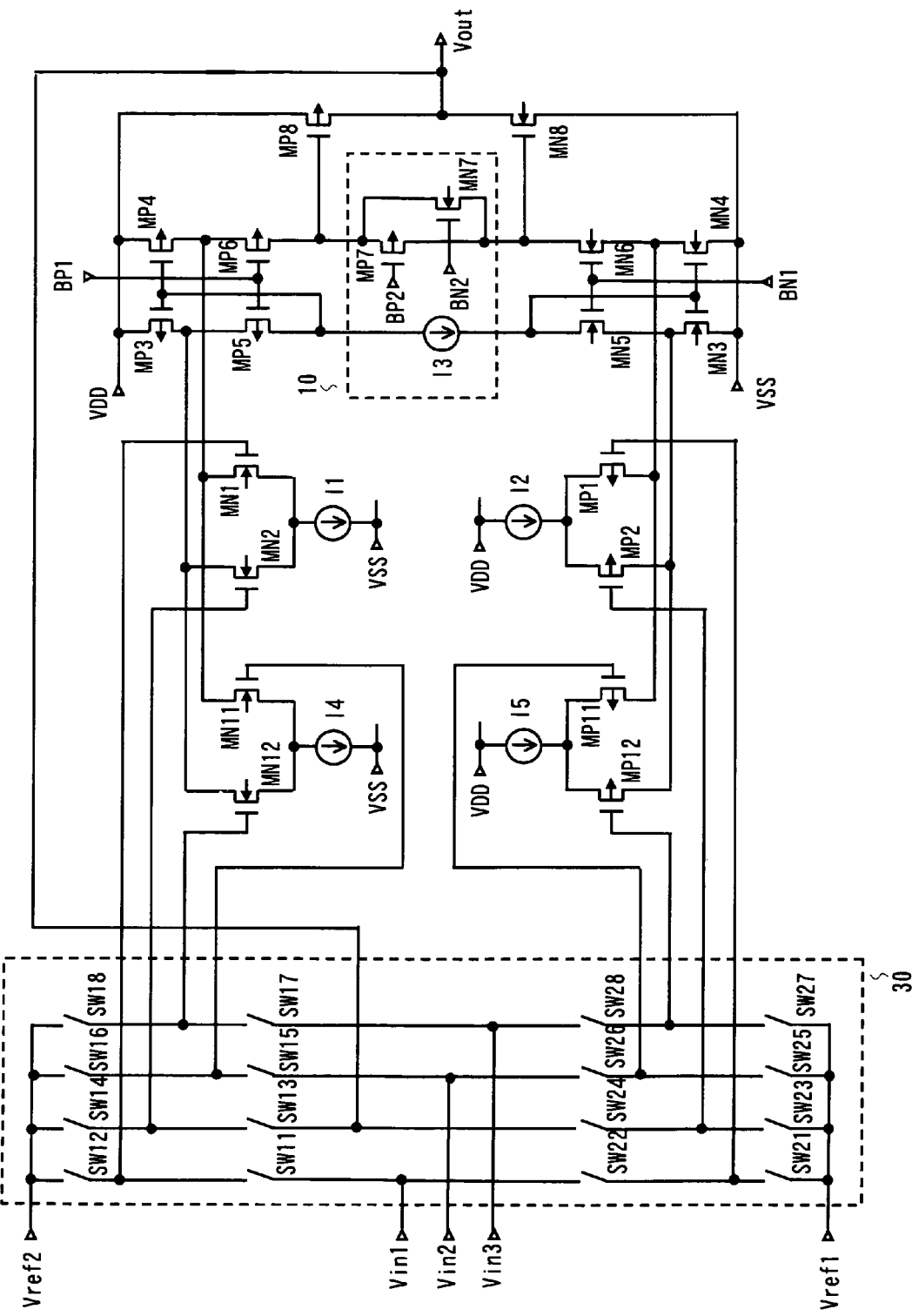

A fifth example of the present invention will be described next. FIG. 6 is a diagram illustrating the configuration of the fifth example of the present invention. For the sake of simplicity, FIG. 6 depicts a case where the bias voltages supplied to the pairs of inputs of two differential pairs having the same polarity are made the same voltage. As shown in FIG. 6, this example is obtained providing the implementation of FIG. 5 with an input control circuit (also referred to as an "input changeover circuit") 30.

As shown in FIG. 6, the input control circuit 30 includes:

switches SW11 and SW12 which are connected between the gate of NMOS transistor MN1 and terminals Vin1 and Vref2, respectively;

switches SW13 and SW14 which are connected between the gate of NMOS transistor MN2 and terminals Vout and Vref2, respectively;

switches SW15 and SW16 which are connected between the gate of NMOS transistor MN11 and terminals Vin2 and Vref2, respectively;

switches SW17 and SW18 which are connected between the gate of NMOS transistor MN12 and terminals Vin3 and Vref2, respectively;

switches SW21 and SW22 which are connected between the gate of PMOS transistor MP1 and terminals Vref1 and Vin1, respectively;

switches SW23 and SW24 which are connected between the gate of PMOS transistor MP2 and terminals Vref1 and Vout, respectively;

switches SW25 and SW26 which are connected between the gate of PMOS transistor MP11 and terminals Vref1 and Vin2, respectively; and switches SW27 and SW28 which are connected between the gate of PMOS transistor MP12 and terminals Vref1 and Vin3, respectively.

FIG. 7 is a diagram illustrating ON/OFF control of the switches of input control circuit 30 shown in FIG. 6. At the time of positive polarity drive, the switches SW11, SW13, SW15, SW17, SW21, SW23, SW25 and SW27 are turned on and the switches SW12, SW14, SW16, SW18, SW22, SW24, SW26 and SW28 are turned off. As a result, the gates of the NMOS transistors MN1 and MN2 are connected to input terminal Vin and output terminal Vout, respectively, and the gates of the NMOS transistors MN11 and MN12 are connected to Vin2 and Vin3, respectively. The gates of the PMOS transistors MP1, MP2, MP11, and MP12 are connected in common with Vref11 (Vref31=Vref32).

At the time of negative polarity drive, the switches SW12, SW14, SW16, SW18, SW22, SW24, SW26 and SW28 are turned on and the switches SW11, SW13, SW15, SW17, SW21, SW23, SW25 and SW27 are turned off. As a result, the gates of differential pairs (MN1, MN2) and (MN11, MN12) are supplied with Vref2 and the gates of PMOS transistors MP1 and MP2 are connected to input terminal Vin and output terminal Vout, respectively. The gates of the PMOS transistors MP11 and MP12 are connected to Vin2 and Vin3, respectively. By virtue of such an arrangement, the differential amplifying circuit of FIG. 6 is such that the NMOS differential pairs and PMOS differential pairs are turned on together in the operating range extending from the power-supply voltage VDD on the high-potential side to the power-supply voltage VSS on the low-potential side. Owing to the resulting interaction between the differential pairs of different polarities (conductivity types), the amplitude-difference deviation can for the most part be kept small over the full grayscale range.

Figure 8:
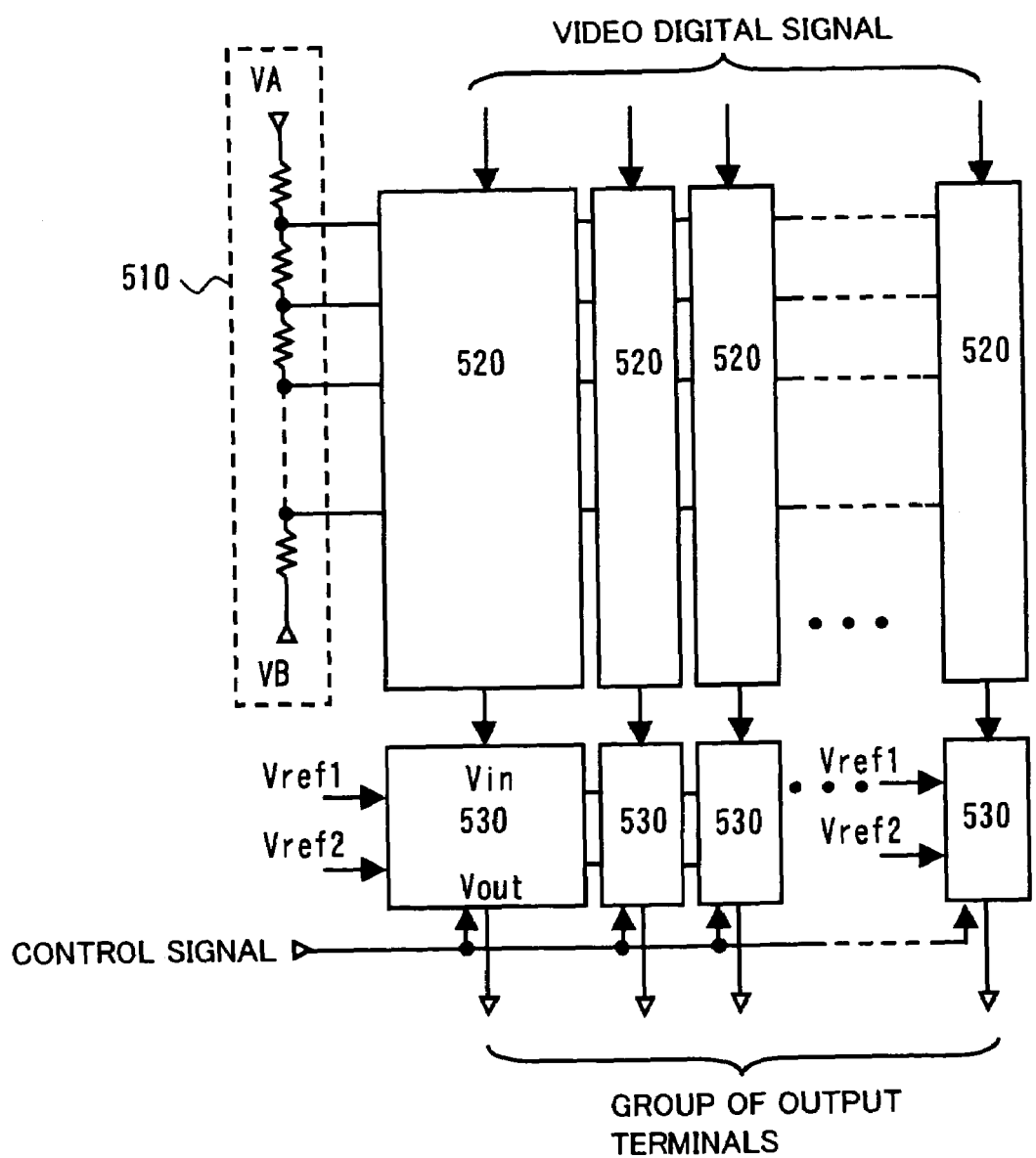
FIG. 8 is a diagram illustrating the configuration of a data driver according to a sixth example of the present invention.
Figure 9:
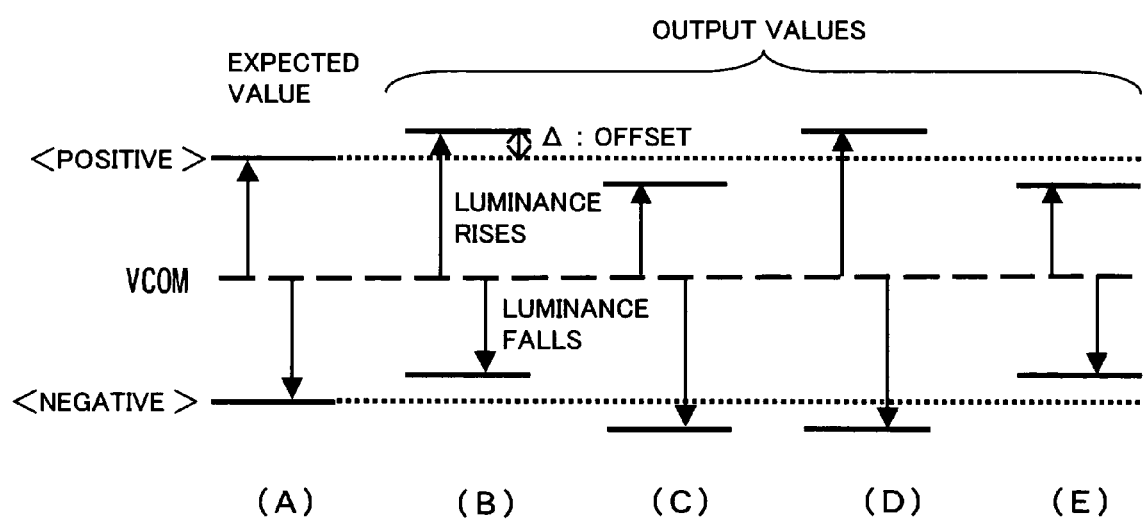
FIG. 9 is a diagram useful in describing combinations of expected values (A) and offsets (B) to (E) of positive-polarity and negative-polarity output values.

FIG. 8 is a diagram illustrating a data driver according to a sixth example of the present invention. As shown in FIG. 8, the data driver includes a grayscale voltage generating circuit 510, a plurality of decoders (selecting circuits) 520 and a plurality of buffer circuits (driver circuits) 530. The grayscale voltage generating circuit 510 comprises a resistor string connected between voltages VA and VB. Grayscale voltages necessary for driver output are output from the taps of the resistor string. Grayscale voltages that have been output from the grayscale voltage generating circuit 510 and a digital video signal are input to the decoders 520. The decoders 520 select grayscale voltages conforming to the video digital signal and output the selected grayscale voltages to input terminals Vin (input terminals Vin1, Vin2, and Vin3) of the buffer circuits 530. Each buffer circuit 530 comprises the differential amplifying circuit (constructing a voltage-follower-type) of any of the examples described with reference to FIGS. 1 to 7. The voltage signals applied to a pair of inputs of the differential pair are changed over by a control signal supplied to the buffer circuit. The output of each buffer circuit 530 is connected to a data line of a display unit. A decoder 520 and buffer circuit 530 are provided for every data line, and the grayscale voltage generating circuit 510 is shared by the plurality of decoders 520. Further, a digital signal that has been processed by a data register, latch and level shifter (none of which are shown), etc., is applied as the video digital signal to the decoders 520. The reference voltages Vref1 and Vref2 are supplied to each of the buffer circuits 530.

In this example, the control signal supplied to the buffer circuits 530 controls the switches of input control circuit 20 or 30 in FIGS. 3 and 6 in the manner illustrated in FIGS. 4 and 7. By executing such switching control, amplitude-difference deviation, which is the deviation between outputs of the data driver, can be reduced uniformly across the full range of grayscale levels. As a result, the occurrence of luminance unevenness across the surface of the panel is suppressed and image quality is improved.

Though the present invention has been described in accordance with the foregoing examples, the invention is not limited to this example and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifying circuit, comprising:

a first differential pair of transistors of a first conductivity-type, having a pair of inputs for respectively receiving an input signal and a feedback signal which is fed back from an output terminal of said differential amplifying circuit;

a second differential pair of transistors of a second conductivity-type, having a pair of inputs for receiving at least one reference signal;

a first load circuit connected to a pair of outputs of said first differential pair;

a second load circuit connected to a pair of outputs of said second differential pair;

a coupling stage that is connected between said first and second load circuits, and couples outputs of said first and second differential pairs; and an amplifying stage that amplifies and outputs an output signal at said output terminal in accordance with outputs of said first and second differential pairs.

2. The circuit according to claim 1, wherein the reference signal comprises a voltage that sets the second differential pair of transistors to an on-state.

3. The circuit according to claim 1, further comprising a first current source and a second current source that provide driving currents to said first and second differential pairs, respectively.

4. The circuit according to claim 1, further comprising:
a third differential pair of transistors of the first conductivity-type having a pair of outputs coupled together with the pair of outputs of said first differential pair;
a fourth differential pair of transistors of the second conductivity-type having a pair of outputs coupled together with the pair of outputs of said second differential pair,
wherein other input signals are respectively applied to a pair of inputs of said third differential pair, and
wherein another reference signals are respectively applied to a pair of inputs of said fourth differential pair.

5. The circuit according to claim 4, wherein said reference signal and said another reference signals include voltages, inclusive of voltages that are equal to each other, that sets said second and fourth differential pairs of transistors to an on-state, respectively.

6. The circuit according to claim 4, further comprising a first current source, a second current source, a third current source, and a fourth current source that provide driving currents to said first to fourth differential pairs, respectively.

7. A differential amplifying circuit, comprising:
a first differential pair of transistors of a first conductivity-type;
a second differential pair of transistors of a second conductivity-type;
a first load circuit connected to a pair of outputs of said first differential pair;
a second load circuit connected to a pair of outputs of said second differential pair;
a coupling stage that is connected between said first and second load circuits, and couples outputs of said first and second differential pairs;
an amplifying stage that amplifies and outputs an output signal at an output terminal of said differential amplifying circuit in accordance with outputs of said first and second differential pairs; and
an input control circuit that controls changeover of signals supplied to pairs of inputs of said first and second differential pairs,
wherein said input control circuit controls changeover between a first connection state in which an input terminal and said output terminal are connected to the pair of inputs of said first differential pair, respectively, and a first reference signal is supplied to the pair of inputs of said second differential pair, and a second connection state in which said input terminal and said output terminal are connected to the pair of inputs of said second differential pair, respectively, and a second reference signal is supplied to the pair of inputs of said first differential pair.

8. The circuit according to claim 7, further comprising a first current source and a second current source that provide driving currents to said first and second differential pairs, respectively.

9. A differential amplifying circuit, comprising:
first to third input terminals;
an output terminal;
a first differential pair of transistors of a first conductivity-type;
a second differential pair of transistors of a second conductivity-type;
a third differential pair of transistors of the first conductivity-type having a pair of outputs coupled together with a pair of outputs of said first differential pair;
a fourth differential pair of transistors of the second conductivity-type having a pair of outputs coupled together with a pair of outputs of said second differential pair;
a first load circuit connected in common with outputs of said first and third differential pairs;
a second load circuit connected in common with outputs of said second and fourth differential pairs;
a coupling stage connected between said first and second load circuits;
an amplifying stage that amplifies and outputs an output signal at said output terminal in accordance with outputs of said first and third differential pairs and outputs of said second and fourth differential pairs; and
an input control circuit that controls changeover of signals supplied to pairs of inputs of said first and third differential pairs and to pairs of inputs of said second and fourth differential pairs,
wherein said input control circuit controls changeover between a first connection state in which said first input terminal and said output terminal are connected to the pair of inputs of said first differential pair, respectively, said second and third input terminals are connected to the pair of inputs of said third differential pair, respectively, and first and second reference signals are supplied to the pair of inputs of said second and fourth differential pairs, respectively, and
wherein a second connection state in which said first input terminal and said output terminal are connected to the pair of inputs of said second differential pair, respectively, said second and third input terminals are connected to the pair of inputs of said fourth differential pair, respectively and third and fourth reference signals are supplied to the pair of inputs of said first and third differential pairs, respectively.

10. The circuit according to claim 9, further comprising a first current source, a second current source, a third current source, and a fourth current source that provide driving currents to said first to fourth differential pairs, respectively.

11. The circuit according to claim 9, wherein said third input terminal is made the same terminal as said output terminal.

12. The circuit according to claim 9, wherein said first and second reference signals have voltages, inclusive of voltages that are equal to each other, that set said second and fourth differential pairs of transistors to an on-state, respectively, and
wherein said third and fourth reference signals include voltages, inclusive of voltages that are equal to each other, that set said first and third differential pairs of transistors to an on-state, respectively.

13. The circuit according to claim 7, wherein said first and second load circuits comprise cascode current mirror circuits, respectively.

14. A differential amplifying circuit comprising:
a first differential pair of transistors of a first conductivity-type; and
a second differential pair of transistors of a second conductivity-type;
the outputs of the first and second differential pairs being coupled by a coupling stage;
said differential amplifying circuit receiving an input signal which is allowed to take on a range of voltages that include high-potential-side and low-potential-side power-supply voltages as a first input, and outputting an output signal corresponding to said input signal, with said output signal being fed back and applied as a second input;

a pair of inputs of one of the differential pairs of said first and second differential pairs being supplied with said input signal and said output signal as the first and second inputs, and a pair of inputs of the other differential pair of said first and second differential pairs being supplied with respective ones of bias voltages that set said other differential pair of transistors to an on-state.

15. The circuit according to claim 14, further comprising an input control circuit for controlling changeover of a connection between pairs of inputs of said first and second differential pairs to a state in which said input signal and said output signal are respectively supplied as the first and second inputs to the pair of inputs of said one differential pair of said first and second differential pairs, and bias voltages that set the transistors of said other differential pair of said first and second differential pairs to an on-state are respectively supplied to the pair of inputs of said other differential pair; and a state in which said input signal and said output signal are respectively supplied as the first and second inputs to the pair of inputs of said other differential pair, and bias voltages that set the transistors of said one differential pair to an on-state are respectively supplied to the pair of inputs of said one differential pair.

16. A differential amplifying circuit, comprising:
a first differential pair of transistors of a first conductivity-type; and
a second differential pair of transistors of a second conductivity-type;
the outputs of said first and second differential pairs being coupled by a coupling stage,
wherein one of said first and second differential pairs receives an input signal and a feedback signal which is fed back from an output terminal, at a pair of inputs thereof, and the other of said first and second differential pairs receives at least one reference signal at a pair of inputs thereof.

17. A differential amplifying circuit according to claim 1, wherein said coupling stage includes a floating current source.

18. A data driver, comprising:
a grayscale voltage generating circuit for generating a plurality of grayscale voltages;
a decoder circuit for selecting a grayscale voltage from said grayscale voltage generating circuit based upon an input video signal, and
a buffer circuit for receiving an output of said decoder circuit and driving a data line;
wherein said buffer circuit comprises the differential amplifying circuit set forth in claim 1.

19. The data driver according to claim 18, wherein a deviation between driver outputs which is the difference in amplitudes between a positive-polarity output and a negative-polarity output at the same grayscale level is made freely reducible uniformly over a full grayscale range.

20. A display device having the data driver set forth in claim 18.

* * * * *